(12) United States Patent
Otremba et al.

(10) Patent No.: US 10,290,566 B2
(45) Date of Patent: May 14, 2019

(54) ELECTRONIC COMPONENT

(71) Applicant: Infineon Technologies Austria AG, Villach (AT)

(72) Inventors: Ralf Otremba, Kaufbeuren (DE); Klaus Schiess, Allensbach (DE); Oliver Haeberlen, St. Magdalen (AT); Matteo-Alessandro Kutschak, Ludmannsdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/493,954

(22) Filed: Sep. 23, 2014

(65) Prior Publication Data
US 2016/0086878 A1 Mar. 24, 2016

(51) Int. Cl.
*H01L 27/06* (2006.01)
*H01L 29/10* (2006.01)
(Continued)

(52) U.S. Cl.
CPC .... *H01L 23/49575* (2013.01); *H01L 21/8258* (2013.01); *H01L 23/49562* (2013.01); *H01L 25/0655* (2013.01); *H01L 27/0629* (2013.01); *H01L 27/0688* (2013.01); *H01L 29/778* (2013.01); *H01L 29/7786* (2013.01); *H01L 29/7838* (2013.01); *H01L 27/0605* (2013.01); *H01L 29/1087* (2013.01);
(Continued)

(58) Field of Classification Search
CPC ........... H01L 23/49575; H01L 29/7786; H01L 23/49562; H01L 29/7838; H01L 29/778; H01L 29/1087; H01L 29/2003; H01L 2224/48137; H01L 2224/49111; H01L 2224/4813; H01L 2224/0603; H01L 2224/48091
See application file for complete search history.

(56) References Cited

U.S. PATENT DOCUMENTS 4,945,266 A * 7/1990 Mori .................... H01L 27/0705
257/136
5,828,263 A * 10/1998 Gantioler ................. G01K 7/01
257/341
(Continued)

FOREIGN PATENT DOCUMENTS

CN 1667838 A 9/2005
DE 102006029928 B3 * 9/2007 ........... H03K 17/063
(Continued)

*Primary Examiner* — Joshua King
(74) *Attorney, Agent, or Firm* — Murphy, Bilak & Homiller, PLLC (57) ABSTRACT

In an embodiment, an electronic component includes a high-voltage depletion mode transistor including a current path coupled in series with a current path of a low-voltage enhancement mode transistor, a diode including an anode and a cathode, and a die pad. A rear surface of the high-voltage depletion mode transistor is mounted on and electrically coupled to the die pad. A first current electrode of the low-voltage enhancement mode transistor is mounted on and electrically coupled to the die pad. The anode of the diode is coupled to a control electrode of the high-voltage depletion mode transistor, and the cathode of the diode is mounted on the die pad.

18 Claims, 4 Drawing Sheets

(51) Int. Cl.
  *H01L 29/20* (2006.01)
  *H01L 29/78* (2006.01)
  *H01L 23/495* (2006.01)
  *H01L 25/065* (2006.01)
  *H01L 29/778* (2006.01)
  *H01L 29/861* (2006.01)
  *H01L 29/872* (2006.01)
  *H01L 21/8258* (2006.01)

(52) U.S. Cl.
  CPC ....... *H01L 29/2003* (2013.01); *H01L 29/8611* (2013.01); *H01L 29/872* (2013.01); *H01L 2224/0603* (2013.01); *H01L 2224/4813* (2013.01); *H01L 2224/48091* (2013.01); *H01L 2224/48137* (2013.01); *H01L 2224/49111* (2013.01)

(56) References Cited

U.S. PATENT DOCUMENTS

| | | | | |
|---|---|---|---|---|
| 6,091,276 A * | 7/2000 | Aiello | ................ | H03K 17/567 327/376 |
| 6,127,723 A * | 10/2000 | Aiello | ................ | H01L 27/0635 257/574 |
| 6,476,571 B1 * | 11/2002 | Sasaki | ................ | B60K 6/26 180/65.1 |
| 6,617,906 B1 * | 9/2003 | Hastings | ................ | H03K 5/08 327/309 |
| 7,777,553 B2 | 8/2010 | Friedrichs | | |
| 8,729,566 B2 | 5/2014 | Domes et al. | | |
| 9,679,880 B2 * | 6/2017 | Ikeda | ................ | H01L 25/18 |
| 10,084,442 B2 * | 9/2018 | Ikeda | ................ | H02M 1/08 |
| 2001/0010379 A1 * | 8/2001 | Yoshida | ................ | H01L 25/071 257/355 |
| 2001/0015437 A1 * | 8/2001 | Ishii | ................ | H01L 21/242 257/12 |
| 2002/0109151 A1 * | 8/2002 | Spampinato | ................ | H01L 27/0761 257/150 |
| 2003/0057479 A1 | 3/2003 | Ahlers et al. | | |
| 2007/0120153 A1 * | 5/2007 | Williams | ................ | H01L 21/8252 257/280 |
| 2008/0197908 A1 * | 8/2008 | Williams | ................ | H02M 3/155 327/431 |
| 2008/0315257 A1 * | 12/2008 | Shiraishi | ................ | H01L 27/0605 257/195 |
| 2009/0189191 A1 * | 7/2009 | Sato | ................ | H01L 27/0605 257/195 |
| 2010/0019279 A1 * | 1/2010 | Chen | ................ | H01L 27/0605 257/194 |
| 2010/0201439 A1 * | 8/2010 | Wu | ................ | H01L 23/492 327/581 |
| 2011/0127606 A1 * | 6/2011 | Bobde | ................ | H01L 27/0705 257/337 |
| 2011/0254018 A1 | 10/2011 | Domes et al. | | |
| 2012/0223321 A1 * | 9/2012 | Lin | ................ | H01L 25/074 257/76 |
| 2012/0241756 A1 * | 9/2012 | Zhang | ................ | H03K 17/08116 257/76 |
| 2012/0256188 A1 * | 10/2012 | McDonald | ................ | H01L 25/074 257/76 |
| 2012/0262220 A1 * | 10/2012 | Springett | ................ | H03K 17/04206 327/430 |
| 2013/0062625 A1 * | 3/2013 | Takada | ................ | H01L 29/41758 257/77 |
| 2014/0016386 A1 * | 1/2014 | Weis | ................ | H02M 7/217 363/126 |
| 2014/0027785 A1 * | 1/2014 | Rose | ................ | H03K 17/08122 257/77 |
| 2014/0138701 A1 * | 5/2014 | Huang | ................ | H01L 29/7787 257/76 |
| 2014/0231829 A1 * | 8/2014 | Kanazawa | ................ | H01L 25/072 257/77 |
| 2014/0264431 A1 * | 9/2014 | Lal | ................ | H01L 27/0883 257/121 |
| 2014/0284662 A1 * | 9/2014 | Ikeda | ................ | H01L 27/0255 257/195 |

FOREIGN PATENT DOCUMENTS

| | | | | |
|---|---|---|---|---|
| DE | 102010027832 B3 * | 7/2011 | ........... | H03K 17/063 |
| EP | 3086472 A1 * | 10/2016 | ........... | H03K 17/102 |
| WO | WO 2013011289 A2 * | 1/2013 | ....... | H03K 17/04123 |

* cited by examiner

ELECTRONIC COMPONENT

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). Compound semiconductors, for example III-V compound semiconductors such as GaAs are also useful in some applications. More recently, silicon carbide (SiC) power devices have been considered. Group III-N-based semiconductor devices, such as gallium nitride (GaN)-based devices, are now emerging as attractive candidates to carry large currents, support high-voltages and to provide very low on-resistance and fast switching times.

SUMMARY

In an embodiment, an electronic component includes a high-voltage depletion mode transistor comprising a current path coupled in series with a current path of a low-voltage enhancement mode transistor, a diode including an anode and a cathode, and a die pad. A rear surface of the high-voltage depletion mode transistor is mounted on and electrically coupled to the die pad. A first current electrode of the low-voltage enhancement mode transistor is mounted on and electrically coupled to the die pad. The anode of the diode is coupled to a control electrode of the high-voltage depletion mode transistor and the cathode of the diode is mounted on the die pad.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off.

As used herein, a "high-voltage device", such as a high-voltage depletion-mode transistor, is an electronic device which is optimized for high-voltage switching applications. That is, when the transistor is off, it is capable of blocking high-voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low-voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the phrase "Group III-Nitride" refers to a compound semiconductor that includes nitrogen (N) and at least one group III element, including aluminum (Al), gallium (Ga), indium (In), and boron (B), and including but not limited to any of its alloys, such as gallium nitride (GaN), aluminum gallium nitride ($Al_xGa_{(1-x)}N$), indium gallium nitride ($In_yGa_{(1-y)}N$) and aluminum indium gallium nitride ($Al_xIn_yGa_{(1-x-y)}N$). Aluminum gallium nitride refers to an alloy described by the formula $Al_xGa_{(1-x)}N$, where x<1.

Figure 1:
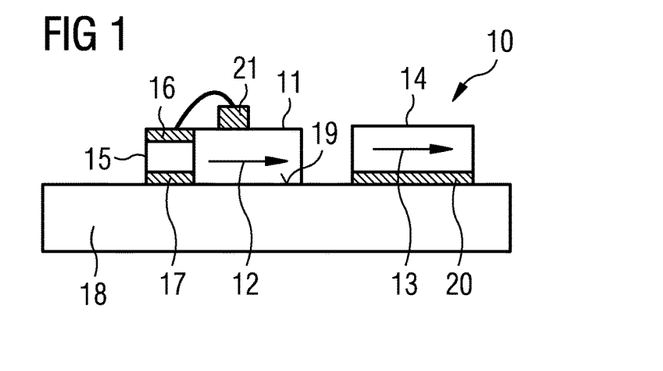
FIG. 1 illustrates an electronic component according to a first embodiment.

FIG. 1 illustrates an electronic component 10 according to a first embodiment. The electronic component 10 includes a high-voltage depletion mode transistor 11 comprising a current path 12 which is coupled in series with a current path 13 of a low-voltage enhancement mode transistor 14. The electronic component 10 further includes a diode 15 and the die pad 18. The diode 15 includes an anode 16 and a cathode 17. The rear surface 19 of the high-voltage depletion mode transistor 11 is mounted on, and electrically coupled to, the die pad 18. The first current electrode 20 of the low-voltage enhancement mode transistor 14 is mounted on, and electrically coupled to the die pad 18. The anode 16 of the diode 15 is coupled to a control electrode 21 of the high-voltage depletion mode transistor 11. The cathode 17 of the diode 15 is mounted on the die pad 18.

The die pad 18 may be coupled to ground potential and provide a common ground for the cathode 17 of the diode 15, for the rear surface 19 high-voltage depletion mode transistor 11 and for the first current electrode 20 of the low-voltage enhancement mode transistor 14. The diode 15 is coupled between the control electrode 21 of the high-voltage depletion mode transistor 11 and the common ground provided by the die pad 18 and may be used to provide a protective function for the high-voltage enhancement mode transistor 14. A protective diode 15 is provided for the high-voltage depletion mode transistor 11 within a single electronic component.

The diode 15 may be used to as a protection diode in the event that the control terminal of the high-voltage depletion mode transistor loses its defined potential, for example upon failure of the gate driver or if the supply voltage of the gate driver is lost. In these events, the high-voltage depletion mode transistor may not block and the bus voltage may reach the low-voltage enhancement mode transistor and may even damage or destroy the low-voltage enhancement mode transistor.

The arrangement of the three devices on a die pad providing a common ground may be used to reduce the inductivity between the two transistor devices. The inductivity between the first current electrode of the high-voltage depletion mode transistor 22, for example the source electrode, and the second current electrode of the low-voltage enhancement mode transistor 14, for example the drain electrode, may be reduced by this arrangement, for example to less than 0.5 nH.

The high-voltage depletion mode transistor 11 may be operatively connected in a cascode arrangement to the low-voltage enhancement mode transistor 14. The high voltage depletion mode transistor 11 is, in operation, normally on. In embodiments in which it is desirable that the high voltage depletion mode transistor 11 is normally off, this may be achieved by operatively connecting the high voltage depletion mode transistor 11 in a cascode arrangement to the low voltage enhancement mode transistor 14.

The high voltage depletion mode transistor 11 may also be directly driven. In these embodiments, the control electrode may be driven by a second gate driver circuit which is provided in addition to a first gate driver circuit for driving the control electrode of the low voltage enhancement mode transistor 14.

In some embodiments, the diode 15 is at least partially integrated in the high-voltage depletion mode transistor 11. In some embodiments, the high-voltage depletion mode transistor 11, the low-voltage enhancement mode transistor 14 and the diode 15 each include a discrete component.

In an embodiment, the control electrode 21 of the high-voltage depletion mode transistor is further coupled to a contact pad of the electronic component 10. This embodiment may be used in embodiments in which the high-voltage depletion mode transistor 11 is directly driven.

In some embodiments, the control electrode 21 of the high-voltage depletion mode transistor 11 is further coupled to a first current electrode of the low-voltage enhancement mode transistor. The low-voltage current electrode of the low-voltage enhancement mode transistor 14 may be a source electrode which is coupled to ground. This arrangement may be used to operatively connect the high-voltage depletion mode transistor 11 in a cascode arrangement to the low-voltage enhancement mode transistor 14.

The high-voltage depletion mode transistor 11 and the low-voltage enhancement mode transistor 14 may be mounted adjacent one another to form a hybrid device.

The high-voltage depletion mode transistor 11 may include a first side including a first current electrode, a second current electrode and the control electrode. The low-voltage enhancement mode transistor 14 may include a first side including a first current electrode and a control electrode and a second side including a second current electrode, the second side opposes the first side. In these embodiments, the high-voltage depletion mode transistor 11 is a lateral device as the drift path of the transistor is lateral and the low-voltage enhancement mode transistor 14 is a vertical device, as the drift path of the transistor is vertical.

In some embodiments, the low-voltage enhancement mode transistor is an n-channel device. The second current electrode of the low-voltage enhancement mode transistor 14 may be coupled to the first current electrode of the high-voltage depletion mode transistor. For example, the drain electrode of the low-voltage enhancement mode transistor 14 may be coupled to the source electrode of the high-voltage depletion mode transistor 11. The first current electrode of the low-voltage enhancement mode transistor 11 may be mounted on the die pad. In these embodiments, the first current electrode may be a source electrode and the low-voltage enhancement mode transistor may be described as having a "source-down" arrangement.

In embodiments in which the low-voltage enhancement mode transistor has a "source-down" arrangement, the control electrode of the low-voltage enhancement mode transistor may be mounted on a lead which is arranged adjacent and spaced apart from the die pad. The low-voltage enhancement mode transistor extends between and bridges a space between the die pad and leads.

In some embodiments, the low-voltage enhancement mode transistor 14 includes a p-channel device. These embodiments, the high-voltage depletion mode transistor may include a first side including a first current electrode, a second current electrode and the control electrode. The low-voltage enhancement mode transistor 14 may include a first side comprising a second current electrode and second side comprising the first current electrode and a control electrode. The second current electrode of the low-voltage enhancement mode transistor may be mounted on the die pad. In these embodiments, the second current electrode may be a drain electrode which is coupled to ground potential. The first current electrode of the low-voltage enhancement mode transistor may be coupled to the first current electrode of the high-voltage depletion mode transistor. In these embodiments, the first current electrode may be a source electrode and may be coupled to an intermediate. The control electrode of the low-voltage enhancement mode transistor may be coupled to a lead of the electronic component which is arranged adjacent and spaced apart from the die pad.

In some embodiments, the diode is monolithically integrated in the high-voltage depletion mode transistor. The high-voltage depletion mode transistor may further include a highly doped substrate of a first conductivity type, a lightly doped layer of the first conductivity type arranged on the substrate and a compound semiconductor layer arranged on the lightly doped layer. The substrate may be an n$^+$ doped silicon substrate and the lightly doped layer may be a deposited n$^-$ doped silicon layer.

The compound semiconductor layer may provide the active region of the high-voltage depletion mode transistor. The compound semiconductor layer may provide a Group III-nitride-based transistor such as a gallium-nitride based high electron mobility transistor (HEMT).

The diode may include a highly doped well of a second conductivity type, for example a p$^+$ doped well, arranged in the lightly doped layer of the first conductivity type. This arrangement provides a pn junction between the highly doped well and the lightly doped layer. The diode may further include a conductive via which is arranged on and electrically coupled to the highly doped well and which is electrically coupled to the control electrode of the high-voltage depletion mode transistor. The diode is monolithically integrated in the high-voltage depletion mode transistor and coupled between the control electrode of the high-voltage depletion mode transistor and ground, since the electrically conductive silicon substrate may be mounted on and electrically coupled to a die pad coupled to ground potential.

The diode may include a Schottky contact in place of the highly doped well, whereby the Schottky contact is formed at the interface with the lightly doped layer. This may be provided by a conductive via including one or more metal layers including a material which is selected to provide a Schottky contact with the lightly doped layer. The conductive via is also coupled to the control electrode of the high-voltage depletion mode transistor.

The highly doped substrate may be a silicon wafer, for example an n$^+$ doped silicon wafer, and the lightly doped layer of the first conductivity may include epitaxially deposited silicon, for example n$^-$ doped silicon.

In some embodiments, the high-voltage depletion mode transistor is a Group III nitride-based High Electron Mobility Transistor (HEMT). In these embodiments, the compound semiconductor layer may include a gallium nitride sublayer arranged on the lightly doped layer and an aluminium gallium nitride sublayer arranged on the gallium nitride sublayer. The interface between the gallium nitride sublayer and the aluminium gallium nitride sublayer may support a two dimensional electron gas (2DEG) formed by induced and spontaneous polarization. A further gallium nitride cap layer and/or a dielectric layer and/or passivation layers may be arranged on the aluminium gallium nitride layer.

The low-voltage enhancement mode transistor may include a p-channel MOSFET, an n-channel MOSFET or an Insulated Gate Bipolar Transistor. The low-voltage enhancement mode transistor may include a power transistor device having a vertical drift path. The power transistor device may include a MOSFET, an Insulated Gate Bipolar Transistor (IGBT) or a Bipolar Junction Transistor (BJT). For MOSFET devices, the first current electrode may be a source electrode, the control electrode may be a gate electrode and the second current electrode may be a drain electrode. For IGBT devices, the first current electrode may be an emitter electrode, the control electrode may be a gate electrode and the second current electrode may be a collector electrode. For BJT devices, the first current electrode may be an emitter electrode, the control electrode may be a base electrode and the second current electrode may be a collector electrode.

Figure 2:
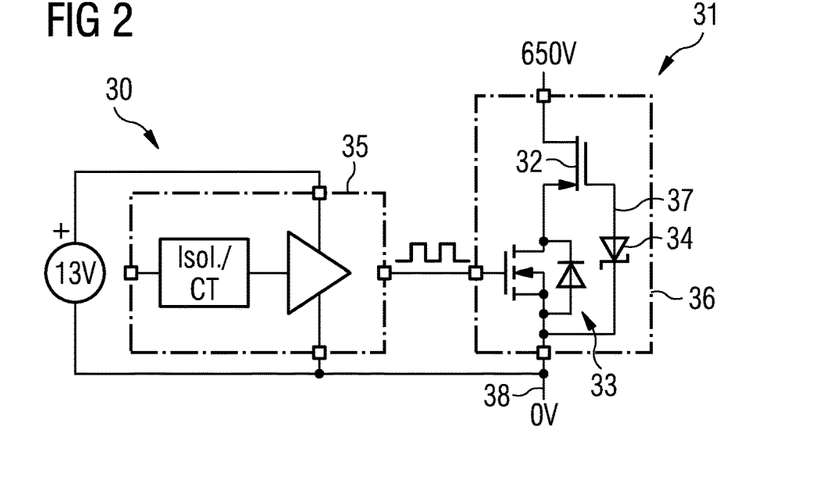
FIG. 2 illustrates a schematic diagram illustrating a cascode circuit.

FIG. 2 illustrates a schematic diagram of a circuit arrangement 30 including a cascode circuit 31 including a high-voltage depletion mode transistor 32, which is normally on, having a current path which is coupled in series with a current path of a second transistor 33 which is normally off, such as a low voltage enhancement mode transistor. The current path extends between the two current electrodes, for example between the source and drain of the high-voltage depletion mode transistor and the source and drain of the low-voltage enhancement mode transistor. The cascode circuit further comprises a diode 34 which is electrically coupled between the control electrode 37 of the high-voltage depletion mode transistor 32 and a common ground 38. In a cascode arrangement, the control electrode of the high-voltage depletion mode transistor is electrically coupled to the first current electrode of the low-voltage enhancement mode transistor. Only the control electrode of the low-voltage enhancement mode transistor is actively controlled by controller circuit 35.

Figure 3:
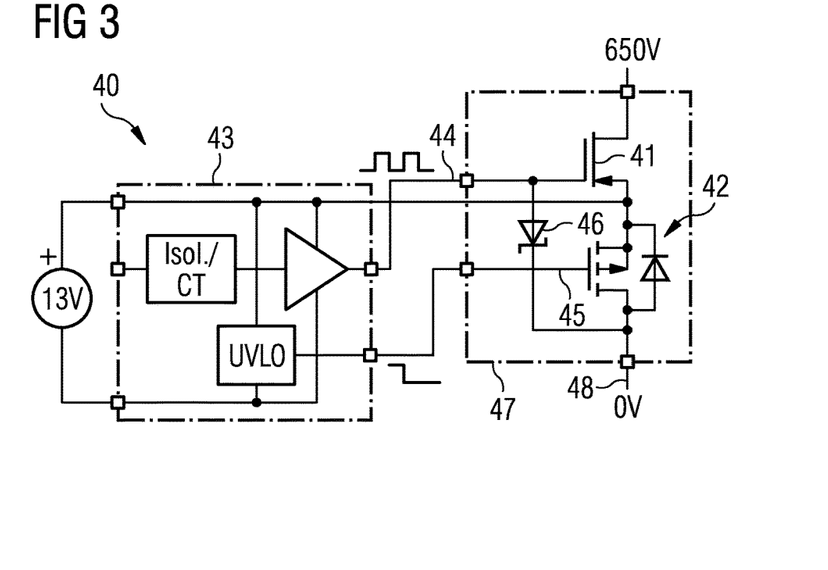
FIG. 3 illustrates a schematic diagram illustrating a circuit arrangement.

FIG. 3 illustrates a schematic diagram of a circuit 40 including a high-voltage depletion mode transistor 41 having a current path that is coupled in series with a current path of a low-voltage enhancement mode transistor 42. In the circuit 40, a controller 43 is used to control the control electrode 44 of the high-voltage depletion mode transistor 41 and the control electrode 45 of the low-voltage enhancement mode transistor 42. Two separate driver circuits may be used to drive the control electrode 44 of the high-voltage depletion mode transistor 41 and the control electrode of the low-voltage enhancement mode transistor 42. This arrangement may be described as a direct drive concept. A diode 46 is provided which is coupled between the control electrode 44 of the high-voltage depletion mode transistor 41 and a common ground 48.

The high-voltage depletion mode transistor, the low-voltage enhancement mode transistor and the diode of the circuits illustrated in FIGS. 2 and 3 are provided in a single electronic component which is indicated with the dashed line 36 in FIGS. 2 and 47 in FIG. 3 according to embodiments described herein.

In some embodiments, the high-voltage depletion mode transistor, the low-voltage enhancement mode transistor and the diode are each provided as a discrete component. In other embodiments, the diode is monolithically integrated in the high-voltage depletion mode transistor. In these embodiments, the high-voltage depletion mode transistor with the integrated diode and the low-voltage enhancement mode transistor are provided as discrete components.

Figure 4:
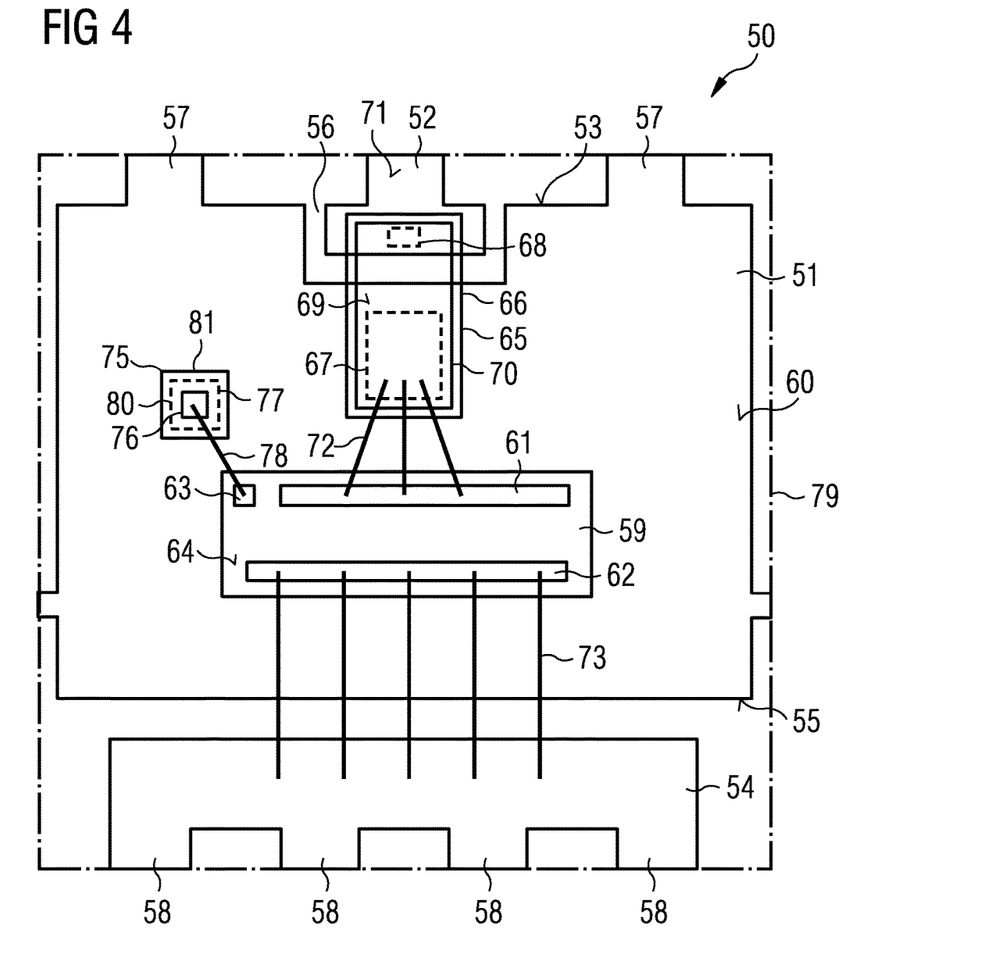
FIG. 4 illustrates an electronic component according to a second embodiment.

FIG. 4 illustrates an electronic component 50 according to a second embodiment. The electronic component 50 includes a die pad 51 and a first lead 52 arranged adjacent and spaced apart from a first side face 53 of the die pad 51 and a second lead 54 arranged adjacent and spaced apart from a second side face 55 of the die pad 51, the second side face 55 opposing the first side face 53. The first side face 53 of the die pad 51 includes an indent 56 in substantially the centre of the side face 53 in which the first lead 52 is arranged. Regions of the first side face 53 of the die pad 51 adjoining the indent 56 have a protruding portion 57 which provides a contact area for the electronic component 50, for example a contact area on the outer and lower surfaces of the electronic component 50 which is electrically coupled to the die pad 51.

The second lead 54 is substantially elongate and extends into four regions 58 which provide contact areas for the electronic component 50, for example contact areas arranged at the outer surface of the electronic component 50 which provide contact areas on the lower surface of the electronic component 50.

The electronic component 50 includes a high-voltage depletion mode channel transistor 59 which is mounted on the upper surface 60 of the die pad 51. The high-voltage depletion mode transistor 59 may be a High Electron Mobility Transistor (HEMT). In this embodiment, the HEMT 59 is gallium nitride-based and is a lateral transistor with a source pad 61, a drain pad 62 and a gate pad 63 arranged on its upper surface 64. The rear surface of the HEMT 59 is mounted on the upper surface 60 of the die pad 51.

The electronic component 50 further includes a low-voltage enhancement mode transistor 65 which, in this embodiment, is an n-channel MOSFET device. The n-channel MOSFET device 65 includes a first surface 66 which includes a source pad 67 and a gate pad 68 and a second surface 69, which opposes the first surface 68, and which includes a drain pad 70.

The n-channel MOSFET device 65 is mounted with its first surface 66 facing towards the upper surface 60 of the die pad 51 and has a so-called "source-down" arrangement. The source pad 67 is mounted on and electrically coupled to the die pad 51 and the gate pad 65 is mounted on the upper surface 71 and is electrically coupled to the first lead 52. The n-channel MOSFET device 65 extends between the die pad 51 and the first lead 52.

The drain pad 67 of the n-channel MOSFET device 65 is electrically coupled to the source pad 61 of the HEMT 59 by, for example, one or more electrically conductive members such as bond wires 72. The drain pad 62 of the HEMT 59 is electrically coupled to the second lead 54, for example, by one or more further electrically conductive members such as bond wires 73.

The electronic component 50 further includes a protective diode 75 which is mounted on the upper surface 60 of the die pad 51. The diode 75 is a vertical device and has an anode 76 arranged on the upper surface 77 and a cathode 80 arranged on the opposing rear surface 81. The cathode is mounted on the upper surface 60 of the die pad 51 is electrically coupled to the die pad 51. The anode 76 is electrically coupled to the gate pad 65 of the high-voltage depletion mode transistor 59, for example, by one or more electrically conductive members such as bond wires 78. The diode 75 is, therefore, coupled between the gate pad 65 of the HEMT 59 and ground since the die pad 51 provides a common ground for the HEMT 59, the n-channel MOSFET 65 and the diode 75.

In other embodiments, the one or more bond wires may be replaced by a different type of electrically conductive member, such as a contact clip or a ribbon. The electronic component 50 further includes a plastic housing 79 which covers the upper surface 60 of the die pad 51, the upper surface 71 of the first lead 52, the upper surface of the second lead 54 and covers the HEMT 59, the n-channel MOSFET 65 and the diode 75.

The HEMT 59 is operatively coupled in a cascode arrangement with the n-channel MOSFET 65 as the gate of the HEMT 59 is coupled to ground potential. Only the gate 68 of the n-channel MOSFET 65 is actively controlled by means of the first lead 52.

Figure 5:
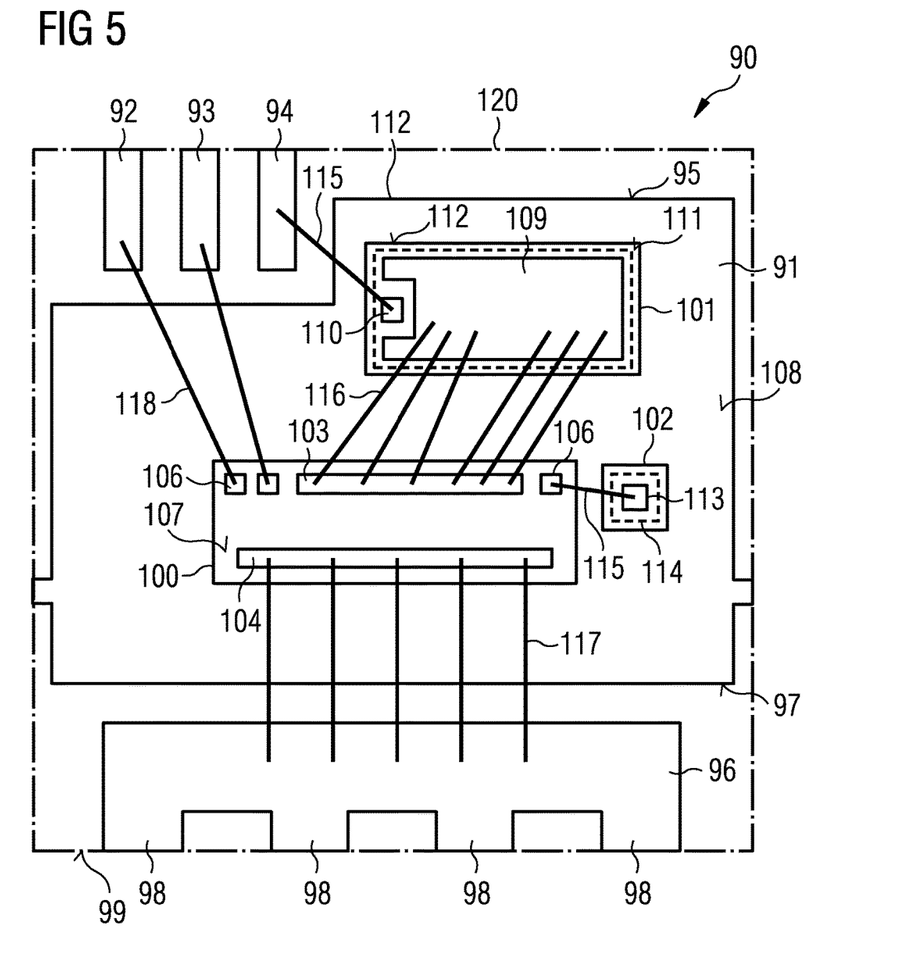
FIG. 5 illustrates an electronic component according to a third embodiment.

FIG. 5 illustrates an electronic component 90 according to a third embodiment. The electronic component 90 includes a die pad 91, three leads 92, 93, 94 arranged adjacent and spaced apart from a first side face 95 of the die pad 91 and a fourth lead 96 adjacent a second side face 97 of the die pad 91 which opposes the first side face 95. The fourth lead 96 is substantially elongate and includes four protruding portions 98 which extend to the outer face 99 of the electronic component 90 and provide outer contacts area on the lower surface of the electronic component 90.

The electronic component 90 includes a high-voltage depletion mode transistor 100 in the form of a gallium nitride-based HEMT, a low-voltage enhancement mode transistor 101 which, in this embodiment is a p-channel MOSFET device, and a diode 102. The gallium nitride-based HEMT 100 is a lateral device and includes a source pad 103, a drain pad 104 and two gate pads 105, 106 on the upper surface 107. The rear surface of the gallium nitride-based HEMT 100 is mounted on the upper surface 108 of the die pad 91. The p-channel MOSFET device 101 includes a source pad 109 and a gate pad 110 on its upper surface 111 and a drain electrode 112 on its lower surface. The drain electrode 112 is mounted on and electrically coupled to the die pad 91.

The diode 102 includes an anode 113 on the upper surface and a cathode 114 the lower surface. The cathode 114 is mounted on, and electrically coupled to, the die pad 91. The gate pad 110 of the p-channel MOSFET 101 is electrically coupled to the third lead 94 by an electrically conductive member, such as a bond wire 115. The source 109 of the p-channel MOSFET 101 is electrically coupled to the source pad 103 of the HEMT 100 by one or more electrically conductive members such as bond wires 116. The drain 104 of the HEMT 100 is electrically coupled to the fourth lead 96 by one or more electrically conductive members such as bond wires 117. One gate pad 105 of the HEMT 100 is electrically coupled to the first lead 92 by an electrically conductive member such as bond wire 118. The second gate 106 is electrically coupled to the anode of the diode 102 by the electrically conductive member 119. The diode 102 is, therefore, coupled between the gate of the HEMT 100 and ground potential provided by the die pad 91. The gate of the HEMT 100 may be directly controlled by means of the first lead 92. The diode 102 provides a protective diode for the HEMT 100. The second lead 93 may be used to provide a sense function, for example for the HEMT 100, for example a source sense function for the HEMT 100.

The electronic component 90 includes a plastic housing 120 which covers the upper surface 60 of the die pad 51, the upper surfaces of the leads and the electronic devices, i.e. the HEMT 100, the p-channel MOSFET device 101 and the diode 102.

The die pad 51 and the leads 92, 93, 94, 96 may include copper. The mounting surfaces may include a mounting layer including a material which is suitable for providing an appropriate joint to the pads. For example, if a soft solder is to be used to mount a pad onto the die pad, the mounting layer may include a material that is wettable by solder, for example Ni/Au.

If a conductive element in the form of a bond wire is used to electrically couple a pad to a lead, the pad may 25 include a material suitable for forming a reliable joint to a bond wire, such as a NiP alloy. The mounting layers are not limited to a single layer and may include two of more layers of differing materials. If a conductive element in the form of a contact clip is used to electrically couple a pad to a lead, the mounting layer may include a material that is wettable by solder.

In some embodiments, the diode, which is coupled between the gate of the high-voltage depletion mode transistor and ground, is monolithically integrated in the high-voltage depletion mode transistor instead of being provided in the form of a discrete component.

Figure 6:
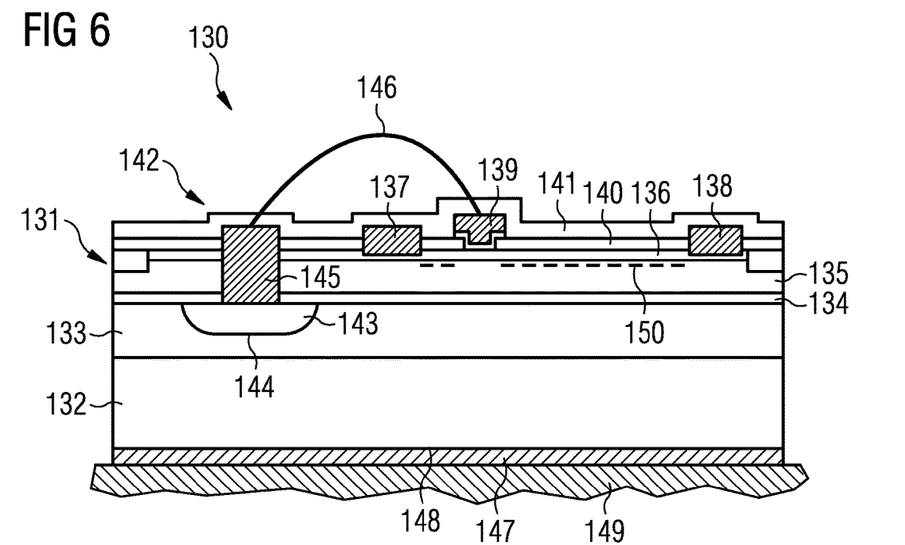
FIG. 6 illustrates a high-voltage depletion mode transistor according to a fourth embodiment.

FIG. 6 illustrates a high-voltage depletion mode transistor 130 which includes a compound semiconductor device 131 in the form of a gallium nitride-based HEMT which is formed on a substrate 132. The substrate 132 comprises, in this embodiment, silicon and is highly doped with a first conductivity type, for example $n^+$ doped. A second silicon layer 133 which is lightly doped with the first conductivity type, for example $n^-$ doped, is arranged on the substrate 132. One or more buffer layers 134, such as AlN, are arranged on the lightly doped silicon layer 133. A gallium nitride layer 135 is arranged on the uppermost buffer layer 134. An aluminium gallium nitride layer 136 is arranged on the gallium nitride layer 135. The interface between the gallium nitride layer 135 and the aluminium gallium nitride layer 136 may support a two dimensional electron gas (2DEG) formed by induced and spontaneous polarization which is schematically illustrated in FIG. 6 by dashed line 150.

A source electrode 137 and a drain electrode 138 are arranged on the aluminium gallium nitride layer 136. The source electrode 137 and the drain electrode 138 may extend partially into the aluminium gallium nitride layer 136 and may extend and contact the gallium nitride layer 135. A gate electrode 139 is arranged on the aluminium gallium nitride layer 136 between the source electrode 137 and the drain electrode 138. The gate electrode 139 may include an insulation layer or a p-doped GaN layer between a metallic gate electrode 139 and the aluminium gallium nitride layer 136. The aluminium gallium nitride layer 135 may be covered by a passivation layer 140 such as silicon nitride. A dielectric layer 141 may be arranged on the passivation layer 140.

The diode 142 may be monolithically integrated by providing a well 143 of the opposing conductivity type, for example p+, in the lightly doped layer 133 to provide a pn junction 144. A conductive via 145 is provided which is electrically coupled to the well 143. The conductive via 145 may extend from the upper surface of the passivation layer 140, through the aluminium gallium nitride layer 135, through the gallium nitride layer 134 and the buffer layers 134 and contacts the well 143. The conductive via 145 is also electrically coupled to the gate 139 which is indicated schematically in FIG. 6 by the line 146. The diode 142 is coupled between the gate electrode 139 and the silicon substrate 132.

A metallic layer 147 is arranged on the rear surface 148 of the substrate 132. As the substrate 132 is highly doped, the cathode of the diode 142 is electrically coupled to the metallic layer 147. The metallic layer 147 may be used to mount the high-voltage depletion mode transistor 130 on a die pad 149 of an electronic component, for example as illustrated in FIGS. 1, 4 and 5. The die pad may provide a common ground for the high-voltage depletion mode transistor 131, the diode 142 and a non-illustrated low-voltage enhancement mode transistor.

Figure 7:
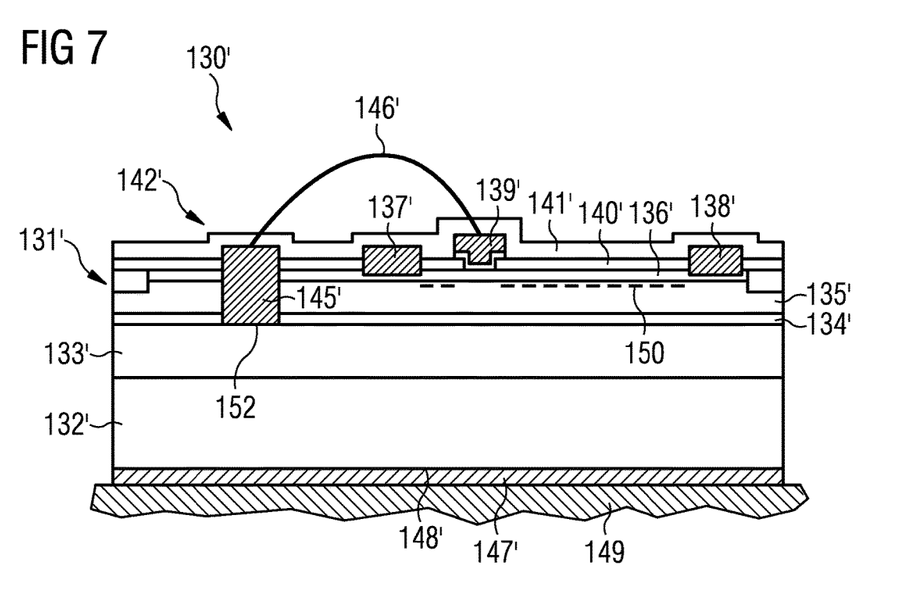
FIG. 7 illustrates a high-voltage depletion mode transistor according to a fifth embodiment.

FIG. 7 illustrates a high-voltage depletion mode transistor 130' includes a highly doped silicon substrate 132', lightly doped silicon layer 133' and a compound semiconductor layer providing a gallium-nitride-based transistor structure 131' as in the embodiment illustrated in FIG. 6. The high-voltage depletion mode transistor 130' also includes a monolithically integrated diode 142'. The diode 142' is produced by a Schottky contact 152 between the conductive via 154' and the lightly doped silicon layer 133'. The Schottky contact 152 can be produced by an appropriate selection of the material forming the conductive via 154 or a layer of the material at the interface to the lightly doped silicon layer 133'. The diode 142' is coupled between the gate electrode 139' and a common ground provided by the die pad 149'.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic component, comprising:
    a high-voltage depletion mode transistor comprising a current path coupled in series with a current path of a low-voltage enhancement mode transistor;
    a diode comprising an anode and a cathode; and
    a die pad,
    the anode of the diode is electrically coupled to a control electrode of the high-voltage depletion mode transistor
    wherein the high-voltage depletion mode transistor comprises a main surface which comprises the control terminal and a rear surface which is opposite from the main surface of the high-voltage depletion mode transistor;
    wherein the low-voltage enhancement mode transistor comprises a rear surface which comprises a first current electrode;

wherein the diode comprises a rear surface arranged opposite from a main surface, the rear surface of the diode comprising the cathode, the main surface of the diode comprising the anode, wherein the high-voltage depletion mode transistor, the low-voltage enhancement mode transistor, and the diode are mounted on a continuous portion of the die pad such that the rear surfaces of the high-voltage depletion mode transistor, the low-voltage enhancement mode transistor, and the diode each face and directly adjoin the continuous portion of the die pad, and wherein the continuous portion of the die pad is directly electrically connected to the cathode and the first current electrode of the low-voltage enhancement mode transistor.

2. The electronic component according to claim 1, wherein the high-voltage depletion mode transistor is operatively connected in a cascade arrangement to the low-voltage enhancement mode transistor.

3. The electronic component according to claim 1, wherein the high-voltage depletion mode transistor is directly driven.

4. The electronic component according to claim 1, wherein the diode is at least partially integrated in the high-voltage depletion mode transistor.

5. The electronic component according to claim 1, wherein the high-voltage depletion mode transistor comprises a discrete component, the low-voltage enhancement mode transistor comprises a discrete component and the diode is provided as a discrete component.

6. The electronic component according to claim 1, wherein the control electrode of the high-voltage depletion mode transistor is further coupled to a contact pad of the electronic component.

7. The electronic component according to claim 1, wherein the control electrode of the high-voltage depletion mode transistor is further coupled to a low-voltage current electrode of the low-voltage enhancement mode transistor.

8. The electronic component according to claim 1, wherein the high-voltage depletion mode transistor and the low-voltage enhancement mode transistor are mounted adjacent one another in a composite package.

9. The electronic component according to claim 1, wherein the high-voltage depletion mode transistor further comprises a highly doped semiconductor substrate of a first conductivity type, a lightly doped semiconductor layer of the first conductivity type on the highly doped semiconductor substrate and a compound semiconductor layer arranged on the lightly doped semiconductor layer.

10. The electronic component according to claim 9, wherein the diode comprises a highly doped p-well arranged in the lightly doped semiconductor layer and a conductive via coupled to the control electrode of the high-voltage depletion mode transistor.

11. The electronic component according to claim 9, wherein the diode comprises a Schottky contact with the lightly semiconductor doped layer and a conductive via coupled to the control electrode of the high-voltage depletion mode transistor.

12. The electronic component according to claim 1, wherein the high-voltage depletion mode transistor is a Group III-nitride-based High Electron Mobility transistor.

13. The electronic component according to claim 1, wherein the low-voltage enhancement mode transistor is selected from the group consisting of an IGBT, a p-channel MOSFET and an n-channel MOSFET.

14. The electronic component according to claim 1, wherein the rear surface of the high-voltage depletion mode transistor, the first current electrode of the low-voltage enhancement mode transistor, and the cathode of the diode are coupled to a common ground.

15. The electronic component according to claim 1, wherein the high-voltage depletion mode transistor, the low-voltage enhancement mode transistor, and the diode are mounted adjacent one another in a horizontal direction on the die pad in a composite package.

16. The electronic component according to claim 1, wherein the main surface of the high-voltage depletion mode transistor further comprises first and second current electrodes, wherein the low-voltage enhancement mode transistor comprises a main surface which is opposite the rear surface of the low-voltage enhancement mode transistor, wherein the main surface of the low-voltage enhancement mode transistor comprises a control terminal and a second current electrode.

17. The electronic component according to claim 16, wherein first current electrode of the low-voltage enhancement mode transistor is a source electrode.

18. The electronic component according to claim 17, wherein first current electrode of the low-voltage enhancement mode transistor is a drain electrode.

* * * * *

UNITED STATES PATENT AND TRADEMARK OFFICE
CERTIFICATE OF CORRECTION

PATENT NO. : 10,290,566 B2
APPLICATION NO. : 14/493954
DATED : May 14, 2019
INVENTOR(S) : Otremba et al.

It is certified that error appears in the above-identified patent and that said Letters Patent is hereby corrected as shown below:

In the Claims

Column 11, Line 19 (Claim 2) please change "a cascade" to -- a cascode --

Signed and Sealed this
Thirtieth Day of July, 2019

Andrei Iancu
*Director of the United States Patent and Trademark Office*